(12) United States Patent
Nakayama

(10) Patent No.: US 12,009,637 B2
(45) Date of Patent: Jun. 11, 2024

(54) SEMICONDUCTOR LIGHT EMITTING DEVICE

(71) Applicant: SONY SEMICONDUCTOR SOLUTIONS CORPORATION, Kanagawa (JP)

(72) Inventor: Yuusuke Nakayama, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 725 days.

(21) Appl. No.: 17/260,883

(22) PCT Filed: Jun. 14, 2019

(86) PCT No.: PCT/JP2019/023620
§ 371 (c)(1),
(2) Date: Jan. 15, 2021

(87) PCT Pub. No.: WO2020/017207
PCT Pub. Date: Jan. 23, 2020

(65) Prior Publication Data
US 2021/0328410 A1    Oct. 21, 2021

(30) Foreign Application Priority Data

Jul. 20, 2018   (JP) .................................. 2018-136627

(51) Int. Cl.
*H01S 5/343*   (2006.01)
*H01S 5/22*   (2006.01)
(52) U.S. Cl.
CPC ............ *H01S 5/34333* (2013.01); *H01S 5/22* (2013.01)

(58) Field of Classification Search
CPC .. H01S 5/34333; H01S 5/22; H01S 5/320275; H01S 5/0202; H01S 5/0287; H01L 33/16; H01L 33/03
(Continued)

(56) References Cited

U.S. PATENT DOCUMENTS

| 7,053,413 | B2 * | 5/2006 | D'Evelyn | ............... | H01L 33/32 257/86 |
| 7,873,088 | B2 * | 1/2011 | Yoshizumi | ............. | B82Y 20/00 372/44.011 |

(Continued)

FOREIGN PATENT DOCUMENTS

| JP | 2009249236 A | 10/2009 |
| JP | 2009266963 A | 11/2009 |

(Continued)

OTHER PUBLICATIONS

International Search Report issued in connection with PCT/JP2019/023620, dated Sep. 17, 2019.

*Primary Examiner* — Vu A Vu
(74) *Attorney, Agent, or Firm* — K&L Gates LLP

(57) ABSTRACT

A semiconductor light emitting device of an embodiment of the present disclosure includes: a nitride semiconductor substrate having, as a principal plane, a plane inclined from a c-plane in an m-axis direction in a range from 60° to 90° both inclusive; an underlayer provided on the nitride semiconductor substrate and including a first layer and a second layer that are stacked on each other, the first layer including $Al_{x2}In_{x1}Ga_{(1-x1-x2)}N$ ($0<x1<1$, $0\le x2<1$) and having a dislocation along an intersection line of the principal plane of the nitride semiconductor substrate and a (1-100) plane, the second layer including $Al_{y2}In_{y1}Ga_{(1-y1-y2)}N$ ($0<y1<1$, $0\le y2<1$) and having a dislocation along an intersection line of the principal plane of the nitride semiconductor substrate (Continued)

and a (0001) plane; and a device layer including an active layer provided on the underlayer.

7 Claims, 7 Drawing Sheets

(58) Field of Classification Search
USPC ........................................................ 372/44.01
See application file for complete search history.

(56) References Cited

U.S. PATENT DOCUMENTS

| | | | |
|---|---|---|---|
| 8,357,946 B2* | 1/2013 | Kyono | H01S 5/320275 |
| | | | 438/47 |
| 8,494,017 B2* | 7/2013 | Sharma | B82Y 20/00 |
| | | | 257/E33.003 |
| 8,816,319 B1 | 8/2014 | Raring | |
| 9,159,553 B2* | 10/2015 | Ohta | H01L 21/0254 |
| 9,236,530 B2* | 1/2016 | Chakraborty | H01L 21/02389 |
| 9,324,913 B2* | 4/2016 | Choe | H01L 21/0254 |
| 2012/0091465 A1 | 4/2012 | Krames et al. | |
| 2012/0100650 A1 | 4/2012 | Speck | |
| 2012/0104360 A1 | 5/2012 | Hardy | |
| 2014/0308769 A1* | 10/2014 | Farrell | H01L 33/005 |
| | | | 438/46 |
| 2019/0103273 A1* | 4/2019 | Furuya | C30B 25/165 |

FOREIGN PATENT DOCUMENTS

| | | |
|---|---|---|
| JP | 2010509177 A | 3/2010 |
| JP | 2010114418 A | 5/2010 |
| JP | 2010192594 A | 9/2010 |
| JP | 2010192865 A | 9/2010 |
| JP | 2010263162 A | 11/2010 |
| JP | 2010263163 A | 11/2010 |
| JP | 2011023535 A | 2/2011 |
| JP | 2011044669 A | 3/2011 |
| JP | 2011077401 A | 4/2011 |
| JP | 2013-502731 A | 1/2013 |
| JP | 2013502730 A | 1/2013 |
| JP | 2013-528948 A | 7/2013 |
| JP | 2013-544027 A | 12/2013 |
| JP | 2014520388 A | 8/2014 |
| JP | 2014532612 A | 12/2014 |
| WO | 2010/041657 A1 | 4/2010 |
| WO | 2012/058584 A1 | 5/2012 |
| WO | WO-2013021606 A1 | 2/2013 |
| WO | WO-2013042297 A1 | 3/2013 |
| WO | 2013/128894 A1 | 9/2013 |
| WO | 2004/054284 A1 | 4/2014 |

* cited by examiner

[FIG. 1]
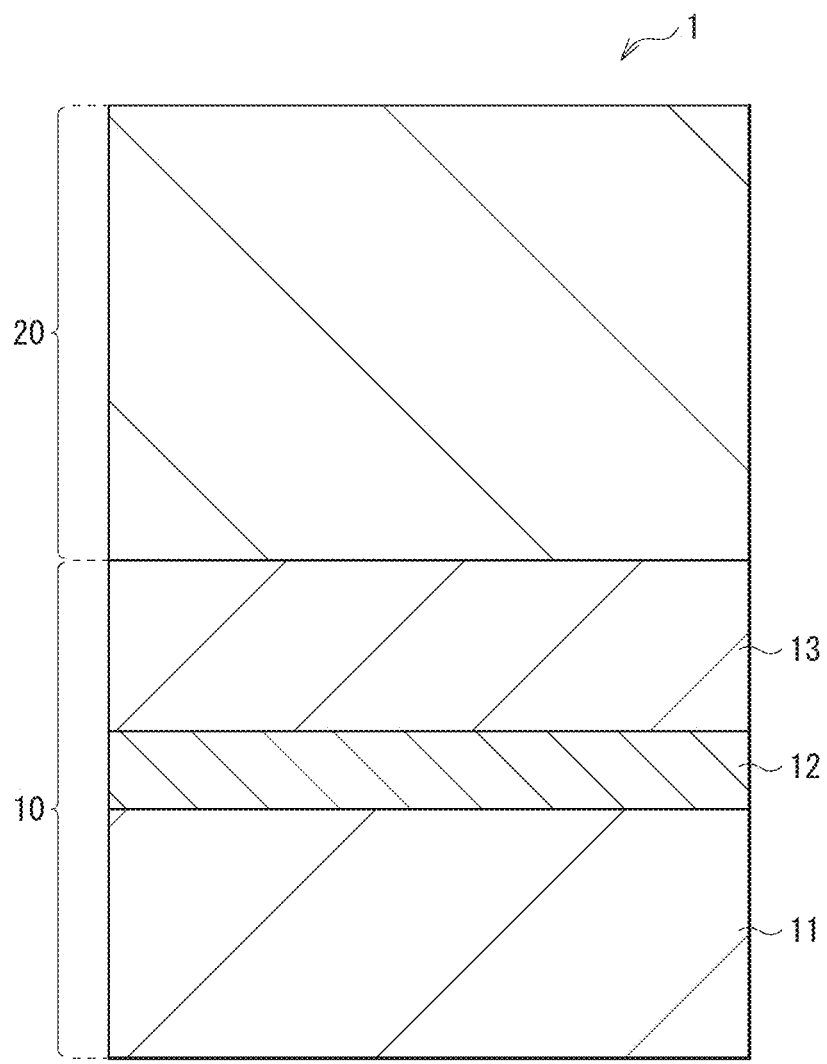

[FIG. 2]
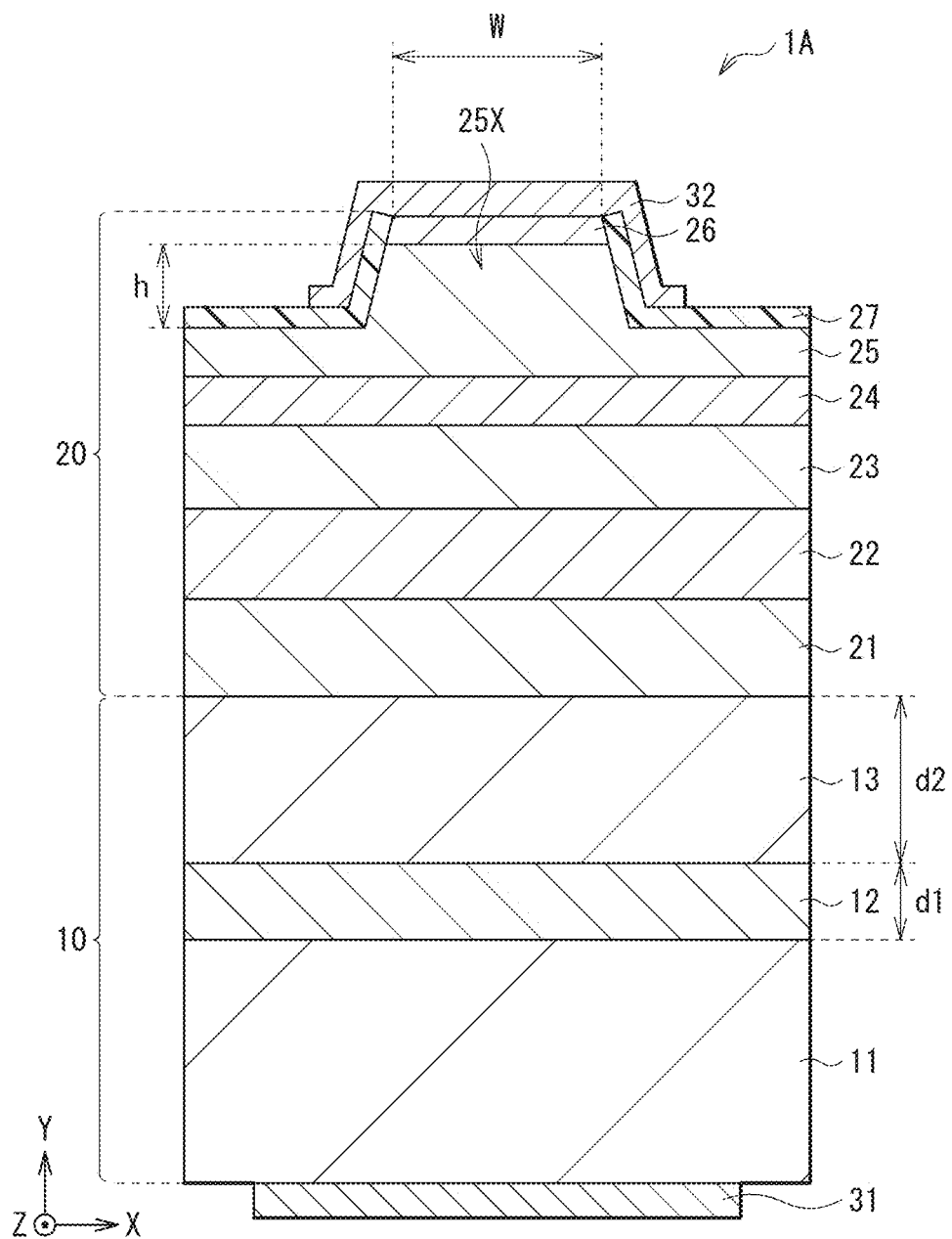

[ FIG. 3 ]
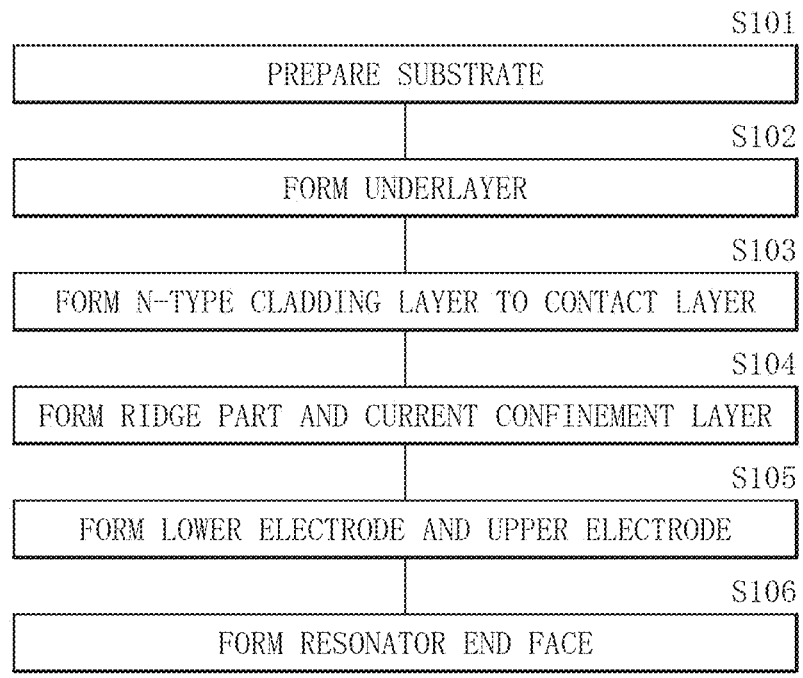
[ FIG. 4A ]
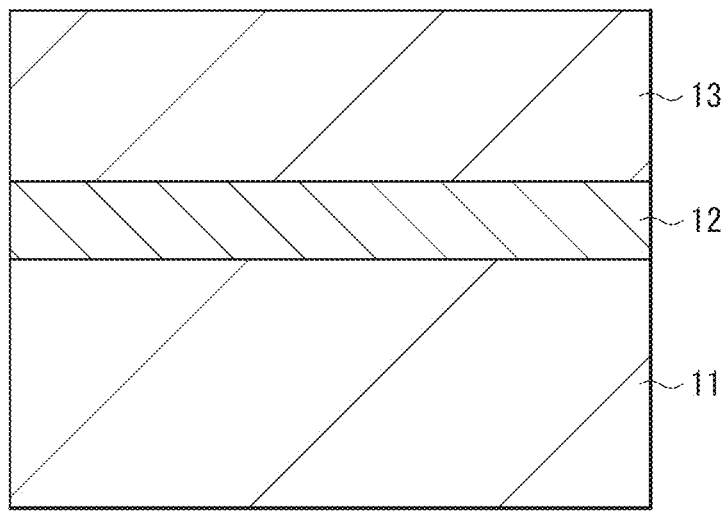

[ FIG. 4B ]
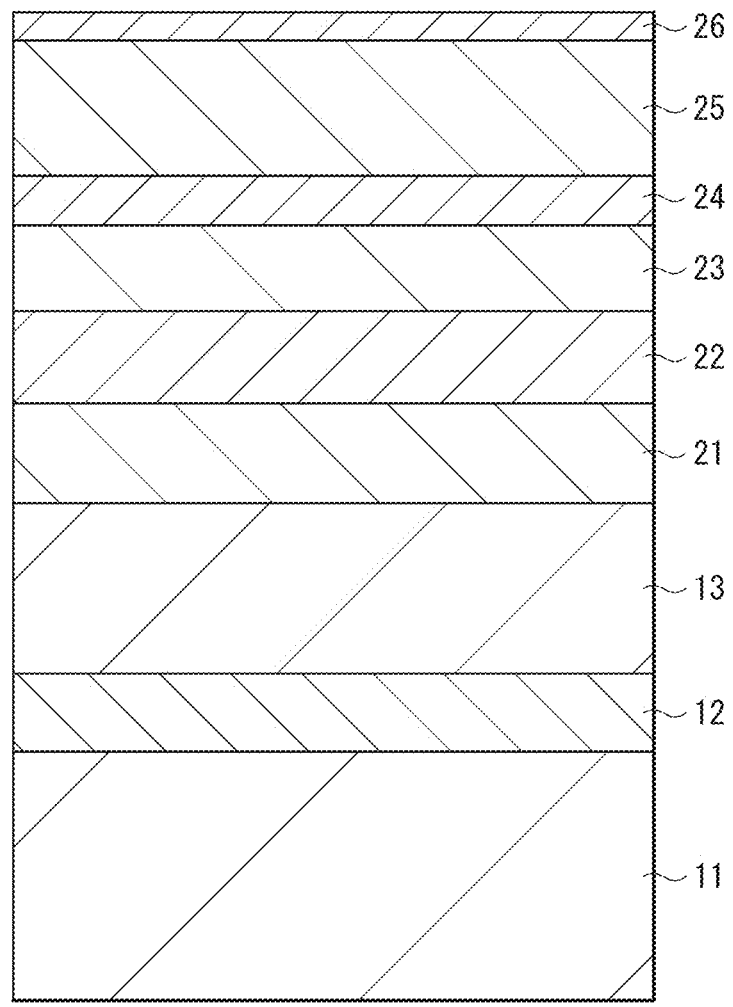

[FIG. 4C]
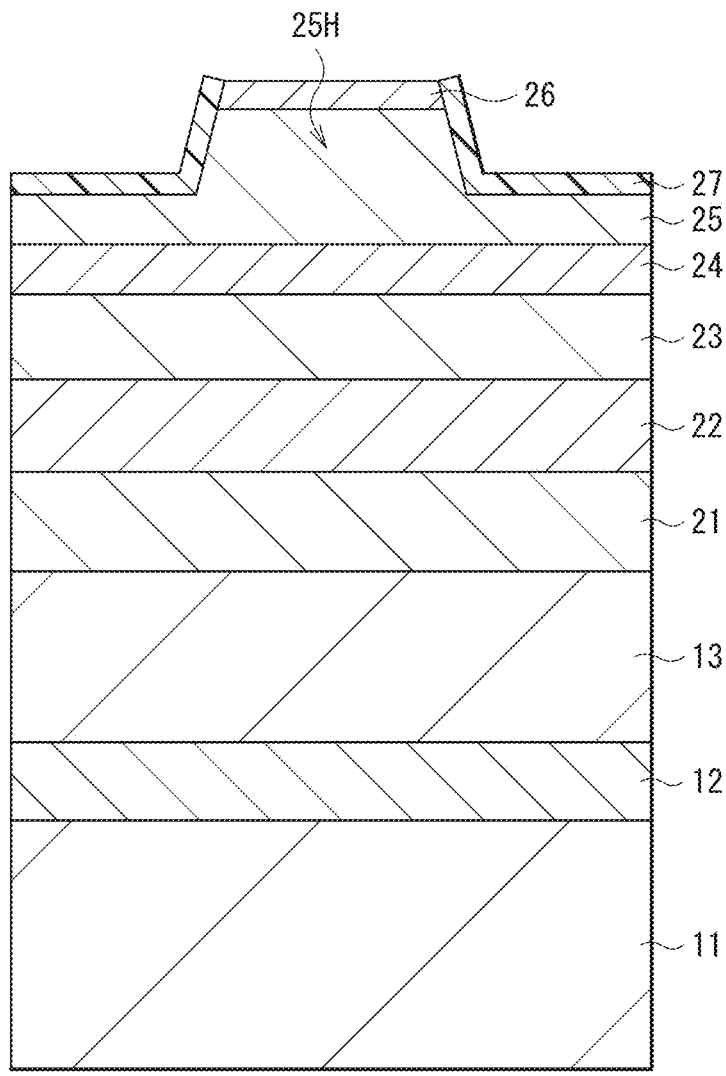
[FIG. 5]
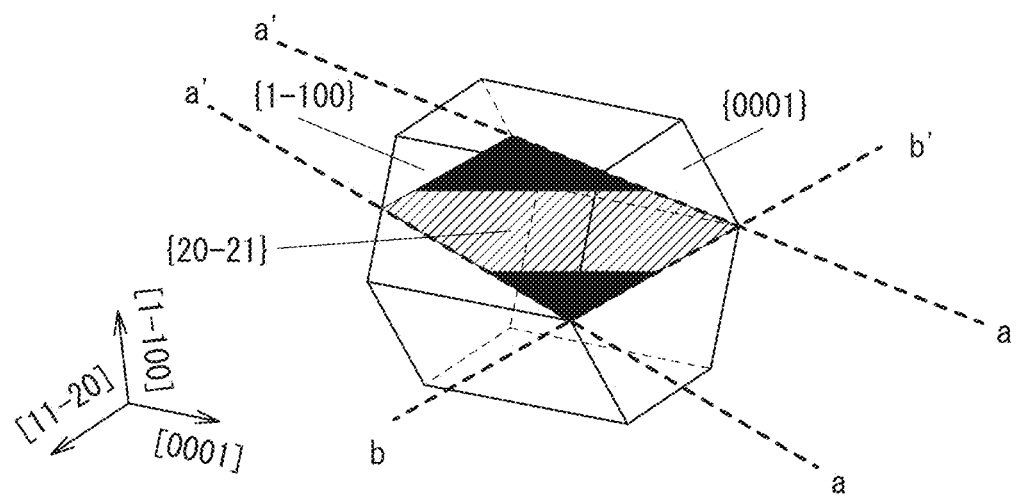

[FIG. 6A]
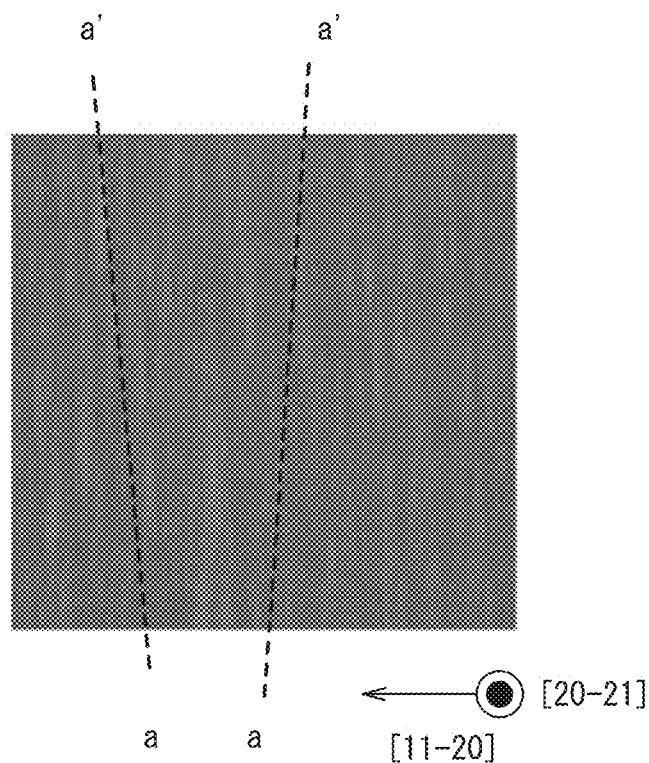
[FIG. 6B]
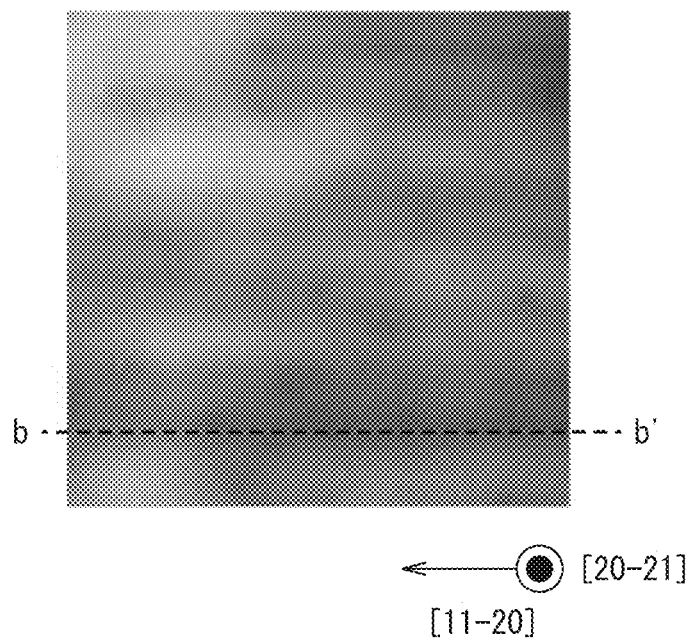

[ FIG. 7 ]
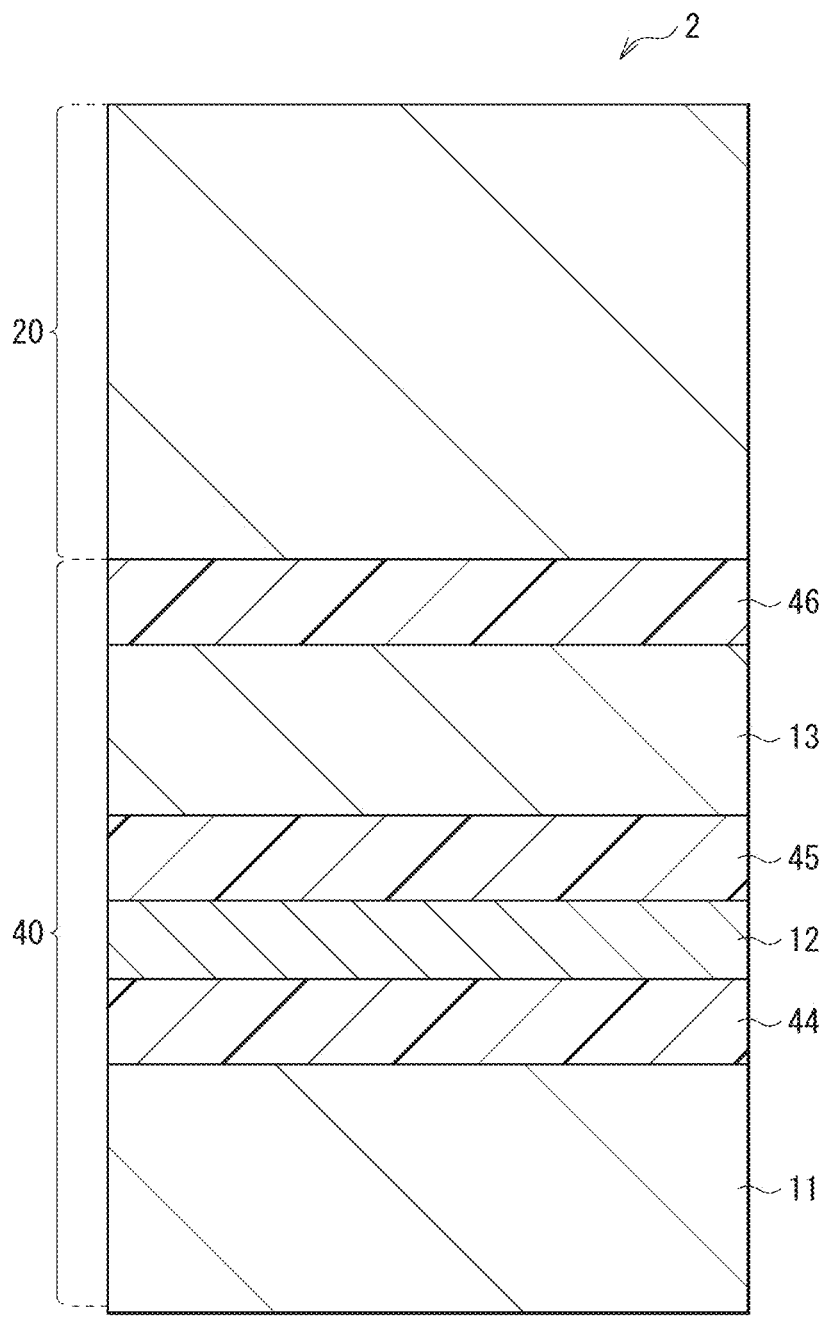

SEMICONDUCTOR LIGHT EMITTING DEVICE

TECHNICAL FIELD

The present disclosure relates to a semiconductor light emitting device using, for example, a nitride semiconductor material.

BACKGROUND ART

Recently, semiconductor lasers (LDs: Laser Diodes) and light emitting diodes (LEDs: Light Emitting Diodes) that use a nitride semiconductor and emit light in a range from a blue band to a green band have been developed actively for use as a light source. Among the above, a semipolar or non-polar nitride semiconductor, which is able to reduce an influence of a piezoelectric field, is effective in configuring a semiconductor light emitting device that emits light in a long wavelength band.

In order to achieve a longer emission wavelength of a semiconductor light emitting device with an active layer including GaInN, it is necessary to increase a content of indium (In). In a case where an active layer having a high In content is crystal-grown on a GaN substrate using a typical method, the active layer having the high In content grows while lattice-matching with the GaN substrate. This leads to a higher lattice mismatch degree, causing a crystal defect or dislocation to be introduced to thereby degrade the crystallinity.

To cope with this, for example, PTL 1 discloses an optical device in which a layer with a lattice-relaxed lattice constant is provided between a GaN substrate and an optical device structure by spatially restricting misfit dislocation(s) around heterointerfaces.

CITATION LIST

Non-Patent Literature

PTL 1: Japanese Unexamined Patent Application Publication (Published Japanese Translation of PCT Application) No. JP2013-502730

SUMMARY OF THE INVENTION

Meanwhile, it is demanded that a semiconductor light emitting device using a nitride semiconductor be improved in light emission characteristics.

It is desirable to provide a semiconductor light emitting device that makes it possible to improve light emission characteristics.

A semiconductor light emitting device of an embodiment of the present disclosure includes: a nitride semiconductor substrate having, as a principal plane, a plane inclined from a c-plane in an m-axis direction in a range from 60° to 90° both inclusive; an underlayer provided on the nitride semiconductor substrate and including a first layer and a second layer that are stacked on each other, the first layer including $Al_{x2}In_{x1}Ga_{(1-x1-x2)}N$ ($0<x1<1$, $0\le x2<1$), and having a dislocation along an intersection line of the principal plane of the nitride semiconductor substrate and a (1-100) plane, the second layer including $Al_{y2}In_{y1}Ga_{(1-y1-y2)}N$ ($0<y1<1$, $0\le y2<1$) and having a dislocation along an intersection line of the principal plane of the nitride semiconductor substrate and a (0001) plane; and a device layer including an active layer provided on the underlayer.

In the semiconductor light emitting device of the embodiment of the present disclosure, the two layers serving as an underlayer that are different from each other in dislocation direction in the layer are provided on the nitride semiconductor substrate having, as the principal plane, the plane inclined from the c-plane in the m-axis direction in the range from 60° to 90° both inclusive. The two layers serving as the underlayer are the first layer including $Al_{x2}In_{x1}Ga_{(1-x1-x2)}N$ ($0<x1<1$, $0\le x2<1$) and the second layer including $Al_{y2}In_{y1}Ga_{(1-y1-y2)}N$ ($0<y1<1$, $0\le y2<1$), of which respective dislocation directions are two directions along the intersection lines of the principal plane of the nitride semiconductor substrate and the (1-100) and (0001) planes. This forms the sufficiently lattice-relaxed underlayer and improves the crystallinity of the active layer to be formed above the nitride semiconductor substrate.

According to the semiconductor light emitting device of the embodiment of the disclosure, as described above, the underlayer in which the first layer including $Al_{x2}In_{x1}Ga_{(1-x1-x2)}N$ ($0<x1<1$, $0\le x2<1$) and the second layer including $Al_{y2}In_{y1}Ga_{(1-y1-y2)}N$ ($0<y1<1$, $0\le y2<1$), which have dislocations in mutually different directions in the layers, are stacked on each other is formed on the nitride semiconductor substrate having, as the principal plane, the plane inclined from the c-plane in the m-axis direction in the range from 60° to 90° both inclusive. This facilitates lattice relaxation of the underlayer and improves the crystal quality of the active layer to be formed above the nitride semiconductor substrate. Accordingly, it is possible to provide the semiconductor light emitting device with superior light emission characteristics.

It is to be noted that the effects described here are not necessarily limitative, and may be any of the effects described in the present disclosure.

BRIEF DESCRIPTION OF DRAWINGS

FIG. 1 is a schematic cross-sectional diagram illustrating a configuration of a semiconductor light emitting device according to an embodiment of the present disclosure.

FIG. 2 is a schematic cross-sectional diagram illustrating an example of a configuration of a semiconductor laser as a specific example of the semiconductor light emitting device illustrated in FIG. 1.

FIG. 3 is a flowchart illustrating a formation method of the semiconductor laser illustrated in FIG. 2.

FIG. 4A is a schematic cross-sectional diagram describing the formation method of the semiconductor laser illustrated in FIG. 2.

FIG. 4B is a schematic cross-sectional diagram that follows FIG. 4A.

FIG. 4C is a schematic cross-sectional diagram that follows FIG. 4B.

FIG. 5 is a diagram describing plane orientations of a substrate and each underlayer illustrated in FIG. 1.

FIG. 6A illustrates an SEM image of a first underlayer.

FIG. 6B illustrates an SEM image of a second underlayer.

FIG. 7 is a schematic cross-sectional diagram illustrating a configuration of a semiconductor light emitting device according to a modification example of the present disclosure.

MODES FOR CARRYING OUT THE INVENTION

In the following, some embodiments of the present disclosure are described in detail with reference to the drawings. The following description is directed to specific examples of the present disclosure, and the present disclosure is not limited to the following embodiments. In addition, the present disclosure is not limited to the arrangement, dimensions, dimensional ratios, and the like of respective components illustrated in the drawings. It is to be noted that description is given in the following order.

1. Embodiment
(An example in which two layers that are different from each other in dislocation direction in the layer are provided as underlayers on a substrate)
   1-1. Configuration of Semiconductor Laser
   1-2. Manufacturing Method of Semiconductor Laser
   1-3. Workings and Effects
2. Modification Example
(An example in which respective intermediate layers are provided between the substrate and a first underlayer, between the first underlayer and a second underlayer, and between the second underlayer and a device layer)

<1. Embodiment>

FIG. 1 schematically illustrates a cross-sectional configuration of a semiconductor light emitting device (a semiconductor light emitting device 1) according to an embodiment of the present disclosure. The semiconductor light emitting device 1 is, for example, a semiconductor laser (LD), a light emitting diode (LED), or the like that emits light in a visible region, particularly, with a wavelength of 480 nm or more. The semiconductor light emitting device 1 of the present embodiment has a configuration in which a first underlayer 12 (a first layer) and a second underlayer 13 that are different from each other in dislocation direction in the layer are stacked in this order on a substrate 11 (a nitride semiconductor substrate) having, as a principal plane, a plane inclined from a c-plane in an m-axis direction in a range from 60° to 90° both inclusive. Further, a device layer 20 (a device) including an active layer (for example, an active layer 23) is provided on the second underlayer 13 (a second layer). It is to be noted that FIG. 1 schematically illustrates the cross-sectional configuration of the semiconductor light emitting device 1 with dimensions and shapes different from actual ones.

(1-1. Configuration of Semiconductor Laser)

FIG. 2 schematically illustrates an example of a cross-sectional configuration of a semiconductor laser 1A as a specific example of the semiconductor light emitting device 1. The semiconductor laser 1A is, for example, a nitride-based semiconductor laser that oscillates laser light having a peak wavelength of 480 nm or more, and is used as a light source for, for example, a laser display, a pointer, or the like. The semiconductor laser 1A has a configuration in which an n-type cladding layer 21, an n-type guide layer 22, the active layer 23, a p-type guide layer 24, a p-type cladding layer 25 with a ridge part 25X, a contact layer 26, and a current confinement layer 27, the current confinement layer 27 being provided on a top surface of the cladding layer 25 and continuously on a side surface of the ridge part 25X and a side surface of the contact layer 26, are stacked in order as the device layer 20 on a template substrate 10 including the above-described substrate 11, the first underlayer 12, and the second underlayer 13. A lower electrode 31 and an upper electrode 32 are provided on a back surface (a surface opposite to a surface where the above-described device layer 20 is formed) of the substrate 11 and the contact layer 26, respectively.

The substrate 11 is a nitride semiconductor substrate having, as a principal plane, a plane inclined from the c-plane in the m-axis direction in the range from 60° to 90° both inclusive. A plane orientation of the substrate 11 is, for example, any one of (10-11), (20-21), (30-31), and (1-100). The substrate 11 has a thickness in a range of, for example, 300 μm to 500 μm.

The first underlayer 12 is provided on the substrate 11 and includes, for example, $Al_{x2}In_{x1}Ga_{(1-x1-x2)}N$ ($0<x1<1$, $0 \leq x2<1$), with a dislocation being introduced in a direction of an intersection line of the principal plane of the substrate 11 and a (1-100) plane (see FIG. 6A), details of which will be described later. The first underlayer 12 preferably has a high indium (In) content. For example, an indium (In) content x1 of the first underlayer 12 is preferably 6% or more, more preferably 20% or more, and still more preferably 30% or more. There is no particular limitation to an upper limit thereof; however, in consideration of conditions for crystal growth of the first underlayer 12 and a surface state after the growth, it is preferable that the upper limit be not more than 50%, for example. A thickness (d1) of the first underlayer 12 is, for example, preferably 3 nm or more, more preferably 10 nm or more, and still more preferably 15 nm or more. The thickness is preferably smaller than that of the second underlayer 13 described later, and an upper limit thereof is less than 50 nm, for example.

The second underlayer 13 is provided on the first underlayer 12 and includes, for example, $Al_{y2}In_{y1}Ga_{(1-y1-y2)}N$ ($0<y1<1$, $0 \leq y2<1$), with a dislocation being introduced in a direction of an intersection line of the principal plane of the substrate 11 and a (0001) plane (see FIG. 6B), details of which will be described later. The second underlayer 13 preferably has a lower (In) content than the first underlayer 12. For example, an indium (In) content y1 of the second underlayer 13 is preferably less than 6%. A lower limit thereof is preferably 0.5% or more, more preferably 2% or more, and still more preferably 4% or more. A thickness (d2) of the second underlayer 13 is preferably greater than that of the first underlayer 12, and is preferably, for example, 50 nm or more, more preferably 200 nm or more, and still more preferably 300 nm or more. An upper limit thereof is preferably not more than 1 μm in consideration of planarity of the surface.

It is to be noted that the above-described dislocation directions of the first underlayer 12 and the second underlayer 13 described above occupy most part, for example, 80% or more, of the layers, and a dislocation other than the above may be introduced. In addition, the first underlayer 12 and the second underlayer 13 are each doped with, for example, silicon (Si) as an n-type dopant. Further, while FIGS. 1 and 2 illustrate an example in which the first underlayer 12 and the second underlayer 13 are stacked in this order, this is non-limiting, and the first underlayer 12 may be formed on the second underlayer 13.

The device layer 20 on the template substrate 10 includes a nitride semiconductor. The nitride semiconductor is, for example, GaN, AlGaN, GaInN, AlGaInN, or the like. The nitride semiconductor may contain, if desired, a boron (B) atom, a thallium (Tl) atom, silicon (Si), oxygen (O), an arsenic (As) atom, a phosphorus (P) atom, an antimony (Sb) atom, etc.

The n-type cladding layer 21 is provided on the second underlayer 13 of the template substrate 10, and includes GaInN doped with, for example, silicon (Si) as an n-type dopant.

The n-type guide layer 22 is provided on the n-type cladding layer 21, and includes GaInN doped with, for example, silicon (Si) as an n-type dopant.

The active layer 23 is provided on the n-type guide layer 22. The active layer 23 has a single quantum well structure or a multiple quantum well structure in which a plurality of quantum well layers is stacked with barrier layers interposed therebetween. Both the quantum well layers and the barrier layers of the active layer 23 include, for example, $Al_aIn_bGa_cN$ ($0 \leq a \leq 1$, $0 \leq b \leq 1$, $0 < c \leq 1$). The quantum well layers preferably contain indium (In) and an In content in the AlGaInN is, for example, preferably 15% or more and not more than 50%, and more preferably 20% or more and not more than 50%. A thickness of the active layer 23 is, for example, preferably 2 nm or more and not more than 10 nm. A peak wavelength of laser light oscillated from the active layer 23 is, for example, preferably 480 nm or more, and more preferably 500 nm or more.

The p-type guide layer 24 is provided on the active layer 23, and includes, for example, undoped GaInN.

The p-type cladding layer 25 is provided on the p-type guide layer 24, and includes, for example, AlGaN doped with magnesium (Mg) as a p-type dopant. In a portion of the p-type cladding layer 25, the ridge part 25X in the shape of a thin stripe extending in a resonator direction for current confinement (in a Z-axis direction in FIG. 2) is formed as an optical waveguide. The ridge part 25X has a width (an X-axis direction in FIG. 2: w) of, for example, 1 μm to 50 μm and a height (a Y-axis direction in FIG. 2: h) of, for example, 0.1 to 1 μm. A length of the ridge part 25X in the resonator direction is, for example, preferably 200 μm or more and not more than 3000 μm.

The contact layer 26 is provided on the ridge part 25X of the p-type cladding layer 25, and includes, for example, GaN doped with magnesium (Mg).

The current confinement layer 27 including, for example, silicon oxide ($SiO_2$) is formed on the p-type cladding layer 25, which includes the side surface of the ridge part 25X, and on the side surface of the contact layer 26.

The lower electrode 31 is formed on the back surface of the substrate 11, and includes a metal. An example of the lower electrode 31 is a multilayer film (Ti/Pt/Au) in which, for example, titanium (Ti), platinum (Pt), and gold (Au) are stacked in order from the substrate 11 side. It is sufficient that the lower electrode 31 is electrically coupled to the n-type cladding layer 21 via the substrate 11, etc., and the lower electrode 31 may not necessarily be formed on the back surface of the substrate 11.

The upper electrode 32 is provided, for example, on the contact layer 26 and continuously over the side surface of the ridge part 25X with the current confinement layer 27 interposed therebetween, and includes a metal as with the lower electrode 31. An example of the upper electrode 32 is a multilayer film (Pd/Pt/Au) in which, for example, palladium (Pd), platinum (Pt), and gold (Au) are stacked in order from the contact layer 26 side. The upper electrode 32 is extended in a band shape to cause a current to be confined, and a region corresponding to the upper electrode 32 in the active layer 23 serves as a light emitting region.

(1-2. Manufacturing Method of Semiconductor Laser)

The semiconductor laser 1A of the present embodiment may be manufactured as follows, for example. FIG. 3 illustrates a flow of a manufacturing method of the semiconductor laser 1A, and FIGS. 4A to 4C illustrate the manufacturing method of the semiconductor laser 1A in the order of processes.

First, the substrate 11 including GaN having, for example, a (20-21) plane as a principal plane for growth is prepared in a reactor (step S101). Next, as illustrated in FIG. 4A, the first underlayer 12 and the second underlayer 13 are formed in this order on a top surface (crystal growth surface) of the substrate 11 by, for example, MOCVD (Metal Organic Chemical Vapor Deposition; metal organic chemical vapor deposition) (step S102).

Subsequently, as illustrated in FIG. 4B, the n-type cladding layer 21, the n-type guide layer 22, the active layer 23, the p-type guide layer 24, the p-type cladding layer 25, and the contact layer 26 are formed in this order on the second underlayer 13 by, for example, MOCVD (step S103).

It is to be noted that in performing MOCVD, trimethyl gallium (($CH_3$)$_3$Ga), for example, is used as a source gas of gallium, trimethyl aluminum (($CH_3$)$_3$Al), for example, is used as a source gas of aluminum, and trimethyl indium (($CH_3$)$_3$In), for example, is used as a source gas of indium. Further, ammonia ($NH_3$) is used as a source gas of nitrogen. Further, monosilane ($SiH_4$), for example, is used as a source gas of silicon, and bis(cyclopentadienyl) magnesium (($C_5H_5$)$_2$Mg), for example, is used as a source gas of magnesium.

Subsequently, as illustrated in FIG. 4C, the ridge part 25X and the current confinement layer 27 are formed (step S104). Specifically, the ridge part 25X is formed by, for example, forming a mask on the contact layer 26 and selectively removing portions of the contact layer 26 and the p-type cladding layer 25 by, for example, RIE (Reactive Ion Etching; reactive ion etching). Next, the current confinement layer 27 is formed by forming, for example, an $SiO_2$ film on the p-type cladding layer 25 and the contact layer 26 and thereafter providing an opening in a top surface of the ridge part 25X.

Subsequently, palladium (Pd), platinum (Pt), and gold (Au) are stacked as films in order on the contact layer 26 and the current confinement layer 27 by, for example, vapor deposition, sputtering, or the like and thereafter patterned into a desired shape by, for example, etching using photolithography to thereby form the upper electrode 32. Next, the substrate 11 is polished from the back surface side to achieve a predetermined thickness, an example of which is a thickness of 90 μm, and thereafter the lower electrode 31 is formed on the back surface of the substrate 11 (step S105).

Subsequently, a resonator end face is formed by cleavage (step S106). Further, dividing into a bar form in a direction parallel to the resonator end face is performed. The semiconductor laser 1A of the present embodiment is thus completed.

Thereafter, an insulating film having a low reflectance is formed on one of end faces of the bar form and an insulating film having a high reflectance is formed on another one of the end faces. The bars are then made into pellets. Thereafter, manufacture is performed according to a typical method of manufacturing a semiconductor laser.

In the semiconductor laser 1A of the present embodiment, a current is injected into the active layer 23 in response to application of a predetermined voltage to between the lower electrode 31 and the upper electrode 32, and electrons and holes are recombined to cause emission of light. The light is repeatedly reflected on a pair of resonator end faces and then outputted as laser light with a predetermined wavelength from one of the end faces. Laser oscillation is thus performed.

(1-3. Workings and Effects)

As described above, semiconductor lasers and light emitting diodes that use a nitride semiconductor and emit light in the range from the blue band to the green band have recently been developed actively for use as a light source. Among the above, a semipolar or non-polar nitride semiconductor, which is able to reduce an influence of a piezoelectric field, is effective in configuring a semiconductor light emitting device that emits light in a long wavelength band.

An active layer formed on a GaN substrate by a typical method grows coherently. To achieve a longer emission wavelength of a semiconductor light emitting device with an active layer including GaInN, it is necessary to increase the content of indium (In). However, a higher In content leads to a larger difference in lattice constant from the GaN substrate, causing a film thickness to exceed a critical one. As a result, a crystal defect or dislocation is introduced into the active layer to degrade its crystallinity. One of solutions to this issue is a method of lattice-relaxing the principal plane of the GaN substrate by providing, on the GaN substrate, a layer having a lattice constant that is lattice-relaxed by spatially restricting misfit dislocation(s) around heterointerfaces. However, the GaN substrate having a semi-polar plane or a non-polar plane as its principal plane has crystal anisotropy and is therefore difficult to sufficiently lattice-relax by the above-described method, which in many cases results in partial relaxation.

In contrast, according to the semiconductor light emitting device 1 (and the semiconductor laser 1A) of the present embodiment, the first underlayer 12 including $Al_{x2}In_{x1}Ga_{(1-x1-x2)}N$ (0<x1<1, 0≤x2<1) and having a dislocation along the direction of the intersection line of the principal plane of the substrate 11 and the (1-100) plane and the second underlayer 13 including $Al_{y2}In_{y1}Ga_{(1-y1-y2)}N$ (0<y1<1, 0≤y2<1) and having a dislocation along the direction of the intersection line of the principal plane of the substrate 11 and the (0001) plane are stacked on the substrate 11 having, as the principal plane, the plane inclined from the c-plane in the m-axis direction in the range from 60° to 90° both inclusive.

FIG. 5 illustrates intersection lines where the (0001) plane and the (1-100) plane intersect a spatially arranged crystal plane of a GaN substrate. The substrate 11 including the GaN substrate having the plane inclined from the c-axis as its principal plane has anisotropy with respect to a growth direction (a direction perpendicular to the substrate principal plane). In a case where, as described above, the first underlayer 12 has a high indium (In) content and is formed as a thin film having a thickness of, for example, 3 nm or more and less than 50 nm, the first underlayer 12 undergoes great distortion locally, which results in introduction of a dislocation in the direction of the intersection line of the principal plane of the substrate 11 and the (1-100) plane, as illustrated in FIG. 6A. In a case where, as described above, the second underlayer 13 has a low indium (In) content and is formed as a thick film having a thickness of, for example, 50 nm or more and not more than 500 nm, the second underlayer 13 undergoes distortion over a wider range than the case of the first underlayer 12, which results in introduction of a dislocation in the direction of the intersection line of the principal plane of the substrate 11 and the (0001) plane, as illustrated in FIG. 6B. By stacking these first underlayer 12 and second underlayer 13 on the substrate 11, it is possible to form sufficiently lattice-relaxed underlayers on the substrate 11. Accordingly, it is possible to improve the crystallinity of the active layer 23 to be formed above the substrate 11 having, as the principal plane, the plane inclined from the c-plane in the m-axis direction in the range from 60° to 90° both inclusive.

As described above, according to the semiconductor light emitting device 1 (and the semiconductor laser 1A) of the present embodiment, the first underlayer 12 including $Al_{x2}In_{x1}Ga_{(1-x1-x2)}N$ (0<x1<1, 0≤x2<1) and having a dislocation in the direction of the intersection line of the principal plane of the substrate 11 and the (1-100) plane and the second underlayer 13 including $Al_{y2}In_{y1}Ga_{(1-y1-y2)}N$ (0<y1<1, 0≤y2<1) and having a dislocation in the direction of the intersection line of the principal plane of the substrate 11 and the (0001) plane, as described above, are stacked on the substrate 11 having, as the principal plane, the plane inclined from the c-plane in the m-axis direction in the range from 60° to 90° both inclusive. This facilitates lattice relaxation in the underlayers and improves the crystal quality of the active layer 23 to be formed above the substrate 11 having, as the principal plane, the plane inclined from the c-plane in the m-axis direction in the range from 60° to 90° both inclusive. Accordingly, it is possible to provide the semiconductor light emitting device 1 (and the semiconductor laser 1A) with superior light emission characteristics. It is particularly possible to improve the light emission characteristics of the semiconductor light emitting device 1 (and the semiconductor laser 1A) including the active layer 23 with a high indium (In) content and having a peak intensity in a long wavelength band of, for example, 480 nm or more.

<2. Modification Example>

FIG. 7 schematically illustrates a cross-sectional configuration of a semiconductor light emitting device (a semiconductor light emitting device 2) according to an embodiment of the disclosure. The semiconductor light emitting device 2 is, as in the foregoing embodiment, a semiconductor laser (LD), a light emitting diode (LED), or the like that emits light in a visible region, particularly, with a wavelength of 480 nm or more, for example. Like the semiconductor light emitting device 1, the semiconductor light emitting device 2 of the present modification example has a configuration in which the device layer 20 (a device) including an active layer (for example, the active layer 23) is provided on a template substrate 40 in which the first underlayer 12 and the second underlayer 13 are stacked in this order on the substrate 11 having, as the principal plane, a plane inclined from the c-plane in the m-axis direction in the range from 60° to 90° both inclusive. The present modification example differs from the foregoing embodiment in that the template substrate 40 is provided with intermediate layers 44, 45, and 46 between the substrate 11 and the first underlayer 12, between the first underlayer 12 and the second underlayer 13, and between the second underlayer 13 and the device layer 20, respectively.

The intermediate layers 44, 45, and 46 include GaN doped with, for example, silicon (Si) as an n-type dopant. The intermediate layers 44, 45, and 46 are preferably provided in a case where the first underlayer 12 and the second underlayer 13 include a quaternary mixed crystal of AlGaInN having a lattice constant larger than that of the substrate 11. The intermediate layers 44, 45, and 46 have a thickness of, for example, 2 nm or more and not more than 100 nm.

As described above, in the case where the first underlayer 12 and the second underlayer 13 are formed using an AlGaInN layer having a lattice constant larger than that of the substrate 11, providing the intermediate layers 44, 45, and 46 including GaN doped with, for example, silicon (Si), between the substrate 11 and the first underlayer 12, between the first underlayer 12 and the second underlayer 13, and between the second underlayer 13 and the device layer 20, respectively, makes it possible to improve planarity. It is thereby possible to achieve effects similar to those of the foregoing embodiment.

It is to be noted that not all of the intermediate layers 44, 45, and 46 have to be provided but any one of them may be provided.

Although the present disclosure has been described above with reference to the embodiment and the modification example, the present disclosure is not limited to the foregoing embodiment, etc., and may be modified in a variety of ways. For example, the components, arrangement, numbers, etc. in the semiconductor laser 1A described as an example in the foregoing embodiment are merely exemplary. Not all of the components have to be provided, or any other component may further be provided.

Moreover, the effects described in the foregoing embodiment, etc. are merely exemplary, and the effects of the present disclosure may be other effects or may further include other effects.

It is to be noted that the present disclosure may have the following configurations.

[1]
A semiconductor light emitting device including:
a nitride semiconductor substrate having, as a principal plane, a plane inclined from a c-plane in an m-axis direction in a range from 60° to 90° both inclusive;
an underlayer provided on the nitride semiconductor substrate and including a first layer and a second layer that are stacked on each other, the first layer including $Al_{x2}In_{x1}Ga_{(1-x1-x2)}N$ ($0<x1<1$, $0 \le x2<1$) and having a dislocation along an intersection line of the principal plane of the nitride semiconductor substrate and a (1-100) plane, the second layer including $Al_{y2}In_{y1}Ga_{(1-y1-y2)}N$ ($0<y1<1$, $0 \le y2<1$) and having a dislocation along an intersection line of the principal plane of the nitride semiconductor substrate and a (0001) plane; and
a device layer including an active layer provided on the underlayer.

[2]
The semiconductor light emitting device according to [1], in which an indium (In) content x1 of the first layer and an indium (In) content y1 of the second layer satisfy Expression (1) below:
(Math. 1)

$$0.5\% \le y1 < 6\% \le x1 \le 100\% \qquad (1).$$

[3]
The semiconductor light emitting device according to [1] or [2], in which a thickness d1 of the first layer and a thickness d2 of the second layer satisfy Expression (2) below:
(Math. 2)

$$3 \text{ nm} \le d1 < 50 \text{ nm} \le d2 \le 1 \text{ μm} \qquad (2).$$

[4]
The semiconductor light emitting device according to any one of [1] to [3], in which the principal plane of the nitride semiconductor substrate is any one of (10-11), (20-21), (30-31), and (1-100).

[5]
The semiconductor light emitting device according to any one of [1] to [4], in which the active layer is coherently grown above a GaInN layer having an In content of 0.5% or more.

[6]
The semiconductor light emitting device according to any one of [1] to [5], in which the active layer oscillates laser light having a peak wavelength of 480 nm or more.

[7]
The semiconductor light emitting device according to any one of [1] to [6], in which the active layer contains indium (In) in a range from 20% to 50% both inclusive.

[8]
The semiconductor light emitting device according to any one of [1] to [7], in which the first layer and the second layer include a quaternary system of AlGaInN and have a lattice constant larger than that of the nitride semiconductor substrate.

This application claims priority from Japanese Patent Application No. 2018-136627 filed on Jul. 20, 2018 with the Japan Patent Office, the entire contents of which are incorporated in the present application by reference.

It should be understood by those skilled in the art that various modifications, combinations, sub-combinations and alterations may occur depending on design requirements and other factors insofar as they are within the scope of the appended claims or the equivalents thereof.

The innvention claimed is:

1. A semiconductor light emitting device comprising:
a nitride semiconductor substrate having, as a principal plane, a plane inclined from a c-plane in an m-axis direction in a range from 60° to 90° both inclusive;
an underlayer provided on the nitride semiconductor substrate and including a first layer and a second layer that are stacked on each other, the first layer including $Al_{x2}In_{x1}Ga_{(1-x1-x2)}N$ ($0<x1<1$, $0 \le x2<1$) and having a dislocation along an intersection line of the principal plane of the nitride semiconductor substrate and a (1-100) plane, the second layer including $Al_{y2}In_{y1}Ga_{(1-y1-y2)}N$ ($0<y1<1$, $0 \le y2<1$) and having a dislocation along an intersection line of the principal plane of the nitride semiconductor substrate and a (0001) plane; and
a device layer including an active layer provided on the underlayer,
wherein an indium (In) content x1 of the first layer and an indium (In) content y1 of the second layer satisfy Expression (1) below:

$$0.5\% \le y1 < 6\% \le x1 \le 100\% \qquad (1).$$

2. The semiconductor light emitting device according to claim 1, wherein the principal plane of the nitride semiconductor substrate is any one of (10-11), (20-21), (30-31), and (1-100).

3. The semiconductor light emitting device according to claim 1, wherein the active layer is coherently grown above a GaInN layer having an In content of 0.5% or more.

4. The semiconductor light emitting device according to claim 1, wherein the active layer oscillates laser light having a peak wavelength of 480 nm or more.

5. The semiconductor light emitting device according to claim 1, wherein the active layer contains indium (In) in a range from 20% to 50% both inclusive.

6. The semiconductor light emitting device according to claim 1, wherein the first layer and the second layer include a quaternary system of AlGaInN and have a lattice constant larger than that of the nitride semiconductor substrate.

7. A semiconductor light emitting device comprising:
a nitride semiconductor substrate having, as a principal plane, a plane inclined from a c-plane in an m-axis direction in a range from 60° to 90° both inclusive;
an underlayer provided on the nitride semiconductor substrate and including a first layer and a second layer that are stacked on each other, the first layer including $Al_{x2}In_{x1}Ga_{(1-x1-x2)}N$ ($0<x1<1$, $0 \le x2<1$) and having a dislocation along an intersection line of the principal plane of the nitride semiconductor substrate and a (1-100) plane, the second layer including $Al_{y2}In_{y1}Ga_{(1-y1-y2)}N$ ($0<y1<1$, $0 \le y2<1$) and having a dislocation along an intersection line of the principal plane of the nitride semiconductor substrate and a (0001) plane; and a device layer including an active layer provided on the underlayer, wherein a thickness d1 of the first layer and a thickness d2 of the second layer satisfy Expression (2) below:

$$3 \text{ nm} \leq d1 < 50 \text{ nm} \leq d2 \leq 1 \text{ μm} \quad (2).$$

* * * * *